United States Patent [19]

Bancal

[11] Patent Number: 5,045,902
[45] Date of Patent: Sep. 3, 1991

[54] VDMOS/LOGIC INTEGRATED CIRCUIT COMPRISING A VERTICAL DEPLETED MOS TRANSISTOR AND A ZENER DIODE AND A METHOD OF MAKING SAME

[75] Inventor: Bernard Bancal, Aix En Provence, France

[73] Assignee: SGS-Thomson Microelectronics S.A., Gentilly, France

[21] Appl. No.: 552,627

[22] Filed: Jul. 16, 1990

[30] Foreign Application Priority Data

Jul. 17, 1989 [FR] France ............................ 89 09911

[51] Int. Cl.⁵ .................. H01L 29/78; H01L 21/265
[52] U.S. Cl. ................. 357/23.4; 357/23.12; 357/13; 357/41; 437/40; 437/141; 437/904; 437/913
[58] Field of Search ............ 357/13, 41, 42, 23.4, 357/23.12; 437/40, 141, 904, 913

[56] References Cited

U.S. PATENT DOCUMENTS 4,163,988  8/1979  Yeh et al. .
4,451,744  5/1984  Adam .
4,792,840 12/1988  Nadd .
4,819,044  4/1989  Murakami ..................... 357/13
4,862,233  9/1989  Matsushita et al. ............ 357/13
4,872,045 10/1989  Baba et al. .................... 357/13

FOREIGN PATENT DOCUMENTS 0294888 12/1988 European Pat. Off. .
0319047  6/1989 European Pat. Off. .

Primary Examiner—Edward J. Wojciechowicz
Attorney, Agent, or Firm—Lowe, Price, LeBlanc and Becker

[57] ABSTRACT

An integrated circuit comprises power elements of the enhanced vertical diffused MOS (VDMOS) transistor type (1) and logic elements of the depleted (2) and enhanced (3) lateral MOS transistor type, and further comprises an internal voltage reference resulting from the series connection of a depleted VDMOS transistor (60) having a common drain with the enhanced VDMOS transistor and a zener diode (70), the cathode of which is connected to the source of the depleted VDMOS transistor and the anode is connected to the substrate and to the gate of this depleted VDMOS transistor.

25 Claims, 2 Drawing Sheets

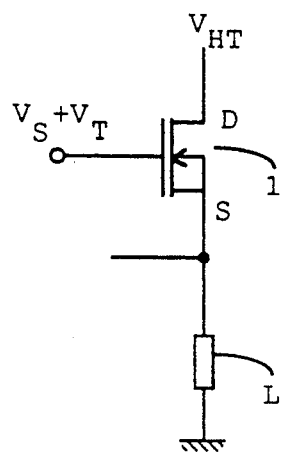
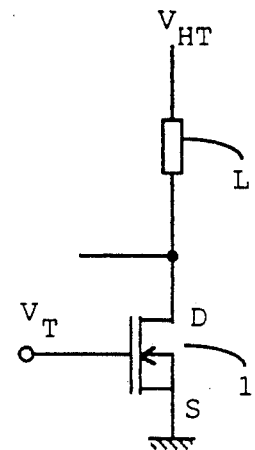
Figure 3　　　　Figure 4
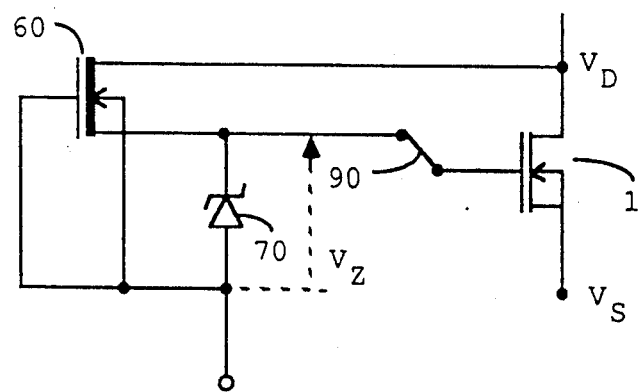
Figure 5

VDMOS/LOGIC INTEGRATED CIRCUIT COMPRISING A VERTICAL DEPLETED MOS TRANSISTOR AND A ZENER DIODE AND A METHOD OF MAKING SAME

BACKGROUND OF THE INVENTION

The present invention relates to integrated circuits including power and logic transistors on the same chip. It more particularly relates to an integrated circuit including a VDMOS power transistor, lateral MOS logic transistors and means for supplying a bias voltage to a gate electrode of the VDMOS transistor, and to a method of forming same.

FIG. 1 is a schematic section view of an integrated circuit described in European Application 87/00325.4 in the name of Thomson CSF. For the sake of simplicity only certain elements of this structure are illustrated (particularly certain thin and thick oxide layers are not shown). In the right-hand portion of FIG. 1 is an illustration of a cell of a power VDMOS (vertical diffused MOS) transistor 1 of the enhanced type and in the left-hand portion of the figure are represented logic components such as a depleted N-channel lateral MOS transistor 2 and an enhanced N-channel lateral MOS transistor 3.

This structure is made on a substrate comprising an N-type layer 10 epitaxially grown on an N+-type silicon wafer 11.

In a first doping step are formed P-type regions 12, especially corresponding to wells wherein the logic portion of the chip is formed.

In a second doping step, P+ regions with a high doping level are formed, this doping level being high enough to obtain ohmic contacts with metallizations. The P+ regions enable an ohmic contact with well 12 and regions 18 of the power VDMOS transistor to be formed to obtain contact with a so-called "bulk" region in an upper region where the channel is formed.

In a third doping step are formed N-type regions 13 especially corresponding to channel regions of the depleted lateral MOS transistors.

Then, one conventionally forms (for example through oxidation, deposition of polycrystalline silicon, etching and reoxidation) gates 21 of the power transistor, gates 22 of the enhanced lateral MOS transistors and gates 23 of the depleted lateral MOS transistors. Gates 21 and 22 are simultaneously formed during this step.

A fourth P-type doping step in the region of the VDMOS transistor forms the channel regions 30 of those transistors with the gate regions acting as a mask.

Then, in a fifth doping step, one forms, by using the above-mentioned gates as a mask, N+ regions especially corresponding to the sources 32 of the power transistor and to the sources and drains 33-36 of the depleted and enhanced lateral MOS transistors.

Lastly, after oxidation and opening of appropriate windows, one forms a metallization layer wherein one etches the source metallization 41 of the power transistor and the source and drain metallizations 42-45 of the lateral transistors as well as other metallizations such as contact metallizations 46 of the wells wherein are formed logic components.

The rear surface of the component which corresponds to the drain of the VDMOS transistor 1 is coated with metallization 48.

In operation, such a structure is generally connected so that its rear surface 48 is at the highest positive voltage ($+V_{HT}$), all the other metallizations being at lower voltages and the metallization 46 of well 12 being usually grounded.

The above described structure is particularly advantageous due to its simplicity. Indeed, it requires a minimum number of masking and doping steps. As seen previously, only five doping types are used. However, this simplicity enables only a limited number of components to be realized in such a structure.

The user usually desires, while maintaining the low cost and reliability associated therewith, to have additional elementary components, such as for example PN diodes that are biased to operate in the forward direction (conductive with a voltage on the P region higher than the voltage on the N region).

More specifically, it is often desired to obtain a reference voltage from the voltage of the rear surface $V_{HT}$ to control the gate of the enhanced VDMOS transistor, for example. This problem has already been discussed for example in U.S. Pat. No. 4,792,840 granted on Dec. 20, 1988 to Bruno Nadd and assigned to Thomson-CSF. When the invention of this patent was made, forming a Zener diode on a structure of the above described type was thought to be practically impossible. The Nadd patent specifically states: "Clipping by means of the Zener diode is difficult to obtain because of the difficulty of integrating this element" (column 2, lines 33-35).

To solve this problem, the above patent suggests applying the high voltage supplied to the lower surface of the chip to the upper chip surface through an N+ diffusion and then distributing this high voltage through a spiral resistor.

This method gives satisfactory results but has the drawback of requiring a large silicon surface. Moreover, as mentioned, this method does not permit derivation of a reference voltage inside the chip; instead the reference voltage is the result of a voltage division through a resistor bridge.

Thus, an object of the invention is to provide a new and improved means for obtaining on the upper surface of an integrated circuit chip the same voltage as is available on the lower surface of the chip.

Another object of the invention is to obtain a reference voltage on the upper surface of an integrated circuit chip from the high voltage available on the lower surface wherein the number of steps necessary to form the chip is not increased.

A further object of the invention is to provide a new and improved integrated circuit chip including a reference voltage source without involving substantial current consumption.

An additional object of the invention is to provide a new and improved integrated circuit chip including a power VDMOS and logic circuit elements wherein a reference voltage is derived on an upper face of the chip and to a method of making same such that the number of steps to form the chip is not increased over the number of steps required to form the chip without the reference voltage on the upper face.

SUMMARY OF THE INVENTION

To achieve those objects, a structure of the above mentioned type is modified to include an additional component, namely an auxiliary vertical depleted MOS transistor.

More specifically, in accordance with one aspect of the invention, a semiconductor substrate having front and back faces is in combination with a metallization layer on the back face connected to a bias voltage, lateral logic transistors having all electrodes thereof on the front face, a VDMOS power transistor having source and gate electrodes on the front face and a drain electrode formed by the metallization layer on the back face, and means for coupling the bias voltage from the metallization layer on the back face through the substrate to a metal region on the front face independently of the operation of the VDMOS power transistor without affecting the operation of the lateral logic transistors and the VDMOS power transistor. The means for coupling includes another VDMOS transistor having source and gate electrodes on the front face. The metallization on the back face forms a drain electrode of the another VDMOS transistor. The metal region includes the source electrode of the another VDMOS transistor. The gate electrode of the another VDMOS transistor is biased to cause a low impedance to subsist between the source and drain electrodes of the another VDMOS transistor.

In accordance with another aspect of the invention, a semiconductor substrate having front and back faces is in combination with a metallization layer on the back face connected to a bias voltage, lateral logic transistors having all electrodes thereof on the front face, a VDMOS power transistor having source and gate electrodes on the front face and a drain electrode formed by the metallization on the back face, and another VDMOS transistor having source and gate electrodes on the front face. The metallization on the back face forms a drain electrode of the another VDMOS transistor. A metal region on the front face includes the source electrode of the another VDMOS transistor. The gate electrode of the another VDMOS transistor is biased to cause a low impedance to subsist between the source and drain electrodes of the another VDMOS transistor to couple the bias voltage from the metallization layer on the back face to the metal region on the front face.

Preferably the substrate includes first and second layers having like conductivity types and surfaces respectively forming the front and back faces. The second layer has a greater doping concentration than that of the first layer. The means for biasing includes a Zener diode having first and second opposite conductivity regions on the front face in the first layer connected respectively to the gate and source electrodes.

Usually the first conductivity region is of a type opposite to the conductivity type of the first and second layers. The second region is of the same conductivity type as the conductivity type of the first and second layers. The Zener diode is arranged so a region of the first conductivity type surrounds the region of the second conductivity type. Preferably the first and second layers are N doped, and first P regions form first, second and third wells on the first layer for the lateral logic transistors, parts of the power transistor and parts of the another transistor, respectively. Second P regions have a doping level greater than that of the first P regions. The second P regions form the first region of the Zener diode and regions in the first, second and third wells. First N regions on the front face form channels for the power and another transistors. Third P regions on the front face form the first conductivity type region of the Zener diode and a channel of the power transistor. Second N regions on the front face have a doping level greater than the doping level of the first N regions. The second N regions form the second conductivity type region of the Zener diode and source regions for the transistors.

The first P regions, second P regions, first N regions, third P regions and second N regions are respectively formed during first, second, third, fourth and fifth diffusion steps on the front face. The first through fifth diffusion steps are performed in the named order.

In accordance with a further aspect of the invention, a semiconductor substrate having front and back faces is in combination with a metallization layer on the back face connected to a bias voltage, lateral logic transistors having all electrodes thereof on the front face, a VDMOS power transistor having source and gate electrodes on the front face and a drain electrode formed by the metallization layer on the back face, and means for coupling the bias voltage from the metallization layer on the back face through the substrate to a metal region on the front face independently of the operation of the VDMOS power transistor without affecting the operation of the lateral logic transistors and the VDMOS power transistor and for deriving a bias voltage for the gate of the power transistor.

The means for coupling in this combination preferably includes another VDMOS transistor having source and gate electrodes on the front face. The metallization on the back face forms a drain electrode of the another VDMOS transistor. The metal region includes the source electrode of the another VDMOS transistor. The gate electrode of the another VDMOS transistor is biased to cause a low impedance to subsist between the source and drain electrodes of the another VDMOS transistor.

Preferably the substrate includes first and second layers having like conductivity types and surfaces respectively forming the front and back faces. The second layer has a greater doping concentration than that of the first layer. The means for biasing includes a Zener diode having first and second opposite conductivity regions on the front face in the first layer connected respectively to the gate and source electrodes of the another VDMOS transistor. The bias voltage for the gate electrode of the power transistor is derived at the source of the another transistor and is determined by the voltage across the regions of the Zener diode.

In another aspect of the invention, an integrated circuit comprises (a) a semiconductor substrate including an enhanced VDMOS transistor having source, drain and gate electrodes, (b) depleted and enhanced lateral MOS logic transistors, (c) a depleted VDMOS transistor having source, drain and gate electrodes, and (d) a Zener diode having first and second opposite conductivity regions. The drains of said VDMOS transistors have a common connection. The Zener diode opposite conductivity regions is connected to the gate and source electrodes of the depleted VDMOS transistor to establish a reference potential for the gate of the enhanced VDMOS transistor at the source electrode of the depleted VDMOS transistor.

Preferably, one of the logic transistors of this circuit comprises a switch for selectively connecting the reference voltage to the gate electrode of the enhanced VDMOS transistor.

According to an advantage of the invention, by using the above doping steps for the depleted VDMOS transistor and the Zener diode, one obtains a Zener diode, the triggering voltage of which is close to the threshold voltage of the depleted MOS transistor. Thus, this transistor operates close to its blocking state and is therefore fairly resistive, which limits the circuit current consumption.

BRIEF DISCLOSURE OF THE DRAWINGS

The foregoing and other objects, features and advantages of the invention will be apparent from the following detailed description of a preferred embodiment as illustrated in the accompanying figures wherein:

FIG. 1, as previously described, is a schematic sectional view of a prior art integrated circuit structure;

FIGS. 3 and 4 are circuit diagrams of prior art connection modes of an enhanced power transistor and a load; and FIG. 5 is a circuit diagram of an application of the invention.

As conventional in the field of integrated circuit representation, the lateral sizes and the thicknesses of the various layers are not drawn to scale and those various layers or layer portions are arbitrarily enlarged to improve drawing legibility.

DESCRIPTION OF A PREFERRED EMBODIMENT

Figure 1:
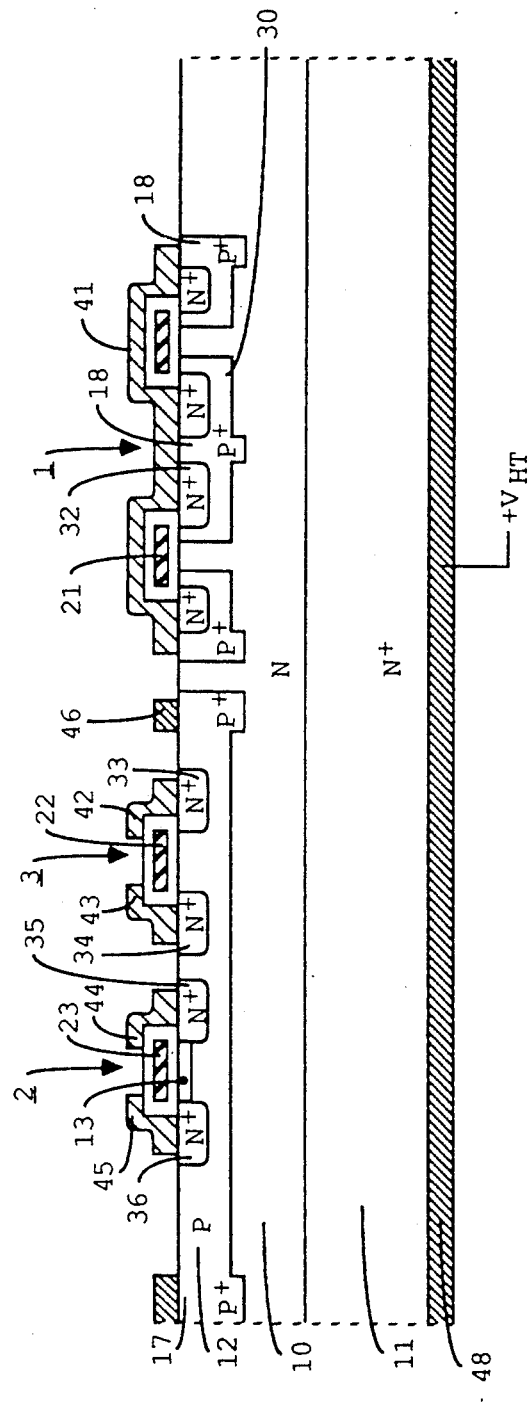
Figure 2:
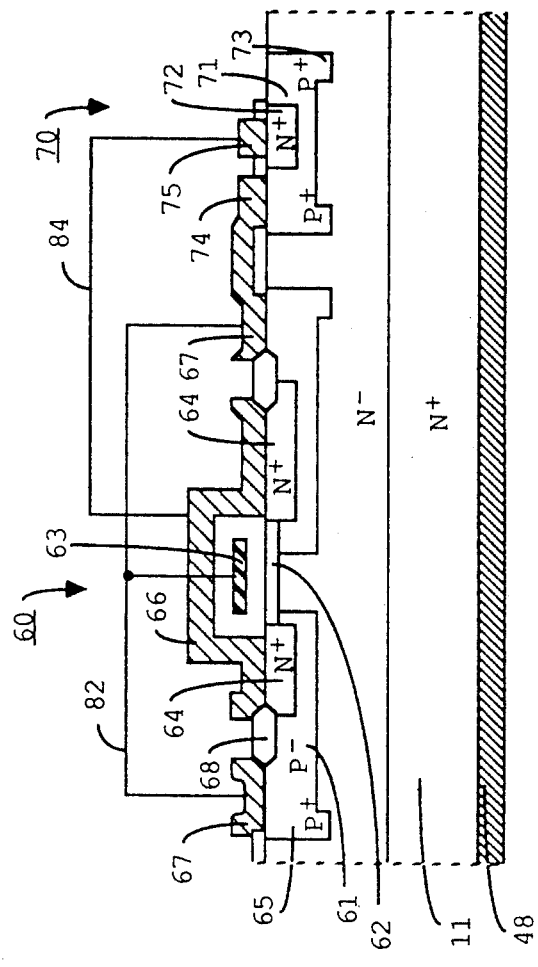
FIG. 2 is a schematic sectional view of a portion of an integrated circuit chip including components according to the invention.

FIG. 2 is a partial side view of a structure according to a preferred embodiment of the invention, formed in a structure of the type shown in FIG. 1. In the left and right portions of FIG. 2 are respectively illustrated depleted VDMOS transistor 60 and Zener diode 70.

P⁻ well 61 of depleted VDMOS transistor 60 is formed during the first doping step simultaneously with the formation of well 12 of the logic circuits. During the third doping step of the structure illustrated in FIG. 1, while the N⁻ channel layer of the depleted logic transistors is being formed, an N⁻ layer 62 corresponding to the depleted channel region of transistor 60 is simultaneously formed. Then, as is conventional, isolated gate 63 is formed (this isolated gate 63 is shown as being not centered with respect to well 61; indeed, there are no self-alignment steps between the formation of the well and the formation of the gate; this is unimportant in practice since the channel is formed in region 62 and not in region 61). Then, during the fifth doping step of the structure illustrated in FIG. 1, N+ source diffusions 64 are performed. P+ regions 65 formed during the second doping step permit contacts to be formed with the well. Metallization 66, forming a source electrode, and well (bulk) metallization 67 are separated by thick oxide layer area 68. Metallization 48, forming the drain of depleted VDMOS transistor 60, is common with the metallization forming the drain of enhanced VDMOS transistor 1.

In the right-hand portion of FIG. 2 is illustrated Zener diode 70, including P-type diffusion region 71 and N+ region 72 that is formed on region 71. Regions 71 and 72 are respectively formed during the fourth and fifth doping steps. Thus, P region 71 has a doping level corresponding to that of wells 30 of the enhanced VDMOS transistor of FIG. 1. Diode 70 is surrounded by P+ ring 73, formed during the second doping step. Anode metallization 74 is formed on ring 73 while cathode metallization 75 is formed on N+ region 72.

Thus, auxiliary depleted VDMOS transistor 60 and Zener diode 70 are formed without adding any steps to the conventional technological process for manufacturing a structure comprising enhanced VDMOS power transistor 1 and logic circuits comprising lateral MOS transistors 2 and 3 of the depleted and enhanced types.

Moreover, with the doping levels usually used in structures such as those of FIG. 1, one obtains a threshold voltage for auxiliary depleted VDMOS transistor 60 (that is, a voltage necessary to block source drain conduction of the VDMOS) of about 10 volts and a Zener voltage for Zener voltage diode 70 of about 10 volts. The Zener voltage is developed between the N+ region and the P layer resulting from the fourth doping step. These usual doping levels are:

P⁻ region resulting from the first doping step: a few $10^{16}$ atoms/cm³,

P region resulting from the second doping step: a few $10^{17}$ atoms/cm³,

N region resulting from the third doping step: a few $10^{16}$ atoms/cm³,

P+ region resulting from the fourth doping step: a few $10^{16}$ atoms/cm³,

N+ region resulting from the fifth doping step: a few $10^{20}$ atoms/cm³.

FIGS. 3 and 4 are circuit diagrams of two conventional ways of connecting a load L in series with a switch constituted by N⁻ channel enhanced VDMOS transistor 1.

In FIG. 3 is shown a so-called "high side" circuit, that is, a circuit wherein a load L is grounded and the drain of VDMOS transistor 1 is connected directly to high voltage VHT. In FIG. 4 is shown a so-called "low side" circuit wherein load L is connected to high voltage $V_{HT}$ and the source of VDMOS transistor 1 is grounded. In those two types of circuit, VDMOS transistor 1 becomes conductive in response to the gate thereof being at a voltage $V_T$ volts higher than its source voltage, VS.

The invention achieves this result with the structure illustrated in FIG. 2, having a circuit diagram as illustrated in FIG. 5.

In FIG. 5, a depleted VDMOS transistor 60 is connected to Zener diode 70. The anode of Zener diode 70 is connected to the gate and to the well of depleted VDMOS transistor 60. The cathode of Zener diode 70 is connected to the source of depleted transistor 60. The drain of depleted transistor 60 is connected to the drain of main enhanced VDMOS transistor 1.

In FIG. 2, connection 82 subsists between the gate and source of transistor 60, while the connection between the well of auxiliary depleted VDMOS transistor 60 and the anode of the Zener diode 70 is formed through metallization 67-74; connection 84 subsists between the cathode of Zener diode 70 and the source of depleted VDMOS transistor.

With this circuit, one obtains across the terminals of Zener diode 70 a voltage VZ which can be applied by switch 90 (realized by a logic circuit comprising enhanced and depleted lateral MOS transistors formed on the same chip) to the gate of the enhanced VDMOS transistor 1. The Zener diode anode is connected to a reference voltage VR which can be either the enhanced VDMOS transistor source, ground, or another chosen voltage lower than VD. This circuit permits, without delay time, a gate voltage to be applied to transistor 1 as soon as switch 90 is switched on.

Should it be necessary to provide a significant current for loading the gate of the enhanced VDMOS transistor 1, it is possible to add to this circuit a Darlington couple of bipolar transistors, the Darlington base being connected to the source of the depleted VDMOS transistor 60, the Darlington collector being connected to the drains of the VDMOS transistors and the Darlington emitter being connected to the terminal of switch 90 opposite to the gate of the enhanced VDMOS transistor 1.

In case the power circuit is of the "high side" type as shown in FIG. 3, enhanced VDMOS transistor 1 is initially blocked. The closure of switch 90 permits the selected 10-volt voltage developed across Zener diode 70 to be applied to the gate of transistor 1. However, while enhanced VDMOS transistor 1 becomes conductive, its source voltage, VS, becomes substantially equal to that of its drain, VD, and it is necessary to conventionally add to the circuit of FIG. 5 a load pump circuit for supplying a voltage about 10 volts higher than VD.

With a "low side" circuit of the type shown in FIG. 4, a voltage is available on the drain of enhanced VDMOS transistor 1 when the latter is in a blocked state. However, when transistor 1 is conductive, the voltage drop across its terminals becomes less than VZ and therefore there is no longer any available voltage at switch 90. The circuit according to the invention however can be used with a capacitor in parallel to Zener diode 70 to maintain the control voltage during the conduction phases of the enhanced VDMOS transistor when power transistor 1 is controlled in switching operation with short and successive conducting and blocking intervals.

Those skilled in the art will be able to bring various variants to the structures and circuits according to the invention. For example, to improve miniaturization, P-type region 71 of the Zener diode anode can be formed in an extension of region 61 corresponding to the well of depleted transistor 60.

I claim:

1. In combination, a semiconductor substrate having front and back faces,
    a metallization layer on the back face connected to a bias voltage,
    lateral logic transistors having all electrodes thereof on the front face,
    a VDMOS power transistor having source and gate electrodes on the front face and a drain electrode formed by the metallization layer on the back face,
    and means for coupling the bias voltage from the metallization layer on the back face through the substrate to a metal region on the front face independently of the operation of the VDMOS power transistor without affecting the operation of the lateral logic transistors and the VDMOS power transistor,
    the means for coupling including another VDMOS transistor having source and gate electrodes son the front face, the metallization on the back face forming a drain electrode of the another VDMOS transistor, the metal region including the source electrode of the another VDMOS transistor, and means for biasing the gate electrode of the another VDMOS transistor to cause a low impedance to subsist between the source and drain electrodes of the another VDMOS transistor.

2. The combination of claim 1 wherein the substrate includes first and second layers having like conductivity types and surfaces respectively forming the front and back faces, the second layer having a greater doping concentration than that of the first layer, the means for biasing including a Zener diode having first and second opposite conductivity regions on the front face in the first layer connected respectively to the gate and source electrodes.

3. The combination of claim 1 wherein the first conductivity region is of a type opposite to the conductivity type of the first and second layers, the second region being of the same conductivity type as the conductivity type of the first and second layers, the Zener diode being arranged so a region of the first conductivity type surrounds the region of the second conductivity type.

4. The combination of claim 2 wherein the first and second layers are N doped,
    first P regions forming first, second and third wells on the first layer for the lateral logic transistors, parts of the power transistor and parts of the another transistor, respectively; second P regions having a doping level greater than that of the first P regions, the second P regions forming the first region of the zener diode, and regions in the first, second and third wells; first N regions on the front face forming channels for said power and another transistors; third P regions on the front face forming the first conductivity type region of the Zener diode and a channel of the power transistor; and second N regions on the front face having a doping level greater than the doping level of the first N regions, the second N regions forming the second conductivity type region of the Zener diode and source regions for said transistors.

5. The combination of claim 4 wherein the first P regions, second P regions, first N regions, third P regions and second N regions are respectively formed during first, second, third, fourth and fifth diffusion steps on the front face, the first through fifth diffusion steps being performed in the named order.

6. The combination of claim 1 wherein the substrate includes first and second layers having surfaces of like first conductivity and type respectively forming the front and back faces, the second layer having a doping level greater than that of the first layer;
    first regions of a second conductivity type forming first, second and third wells on the first layer respectively for the lateral logic transistors, parts of the power transistor and parts of the another transistor; second regions of the second conductivity type having a doping level greater than that of the first regions of the second conductivity type and forming regions in the first, second and third wells; first regions of the first conductivity type on the front face forming channels for said power and another transistors; third regions of the second conductivity type on the front face forming a channel of the power transistor; and second regions of the first conductivity type on the front face having a doping level greater than the doping level of the first regions of the first conductivity type, forming source regions for said transistors.

7. The combination of claim 6 wherein the first regions of the second conductivity type, second regions of the second conductivity type, first regions of the first conductivity type, third regions of the second conductivity type and second regions of the first conductivity type are respectively formed during first, second, third, fourth and fifth diffusions steps on the front face, the first through fifth diffusion steps being performed in the named order.

8. The combination of claim 6 wherein the first and second conductivity types are respectively N and P.

9. The combination of claim 8 wherein the power and another VDMOS transistors are respectively of the enhanced and depleted types.

10. The combination of claim 1 wherein the power and another VDMOS transistors are respectively of the enhanced and depleted types.

11. In combination, a semiconductor substrate having front and back faces,
   a metallization layer on the back face connected to a bias voltage,
   lateral logic transistors having all electrodes thereof on the front face,
   a VDMOS power transistor having source and gate electrodes on the front face and a drain electrode formed by the metallization on the back face,
   another VDMOS transistor having source and gate electrodes on the front face, the metallization on the back face forming a drain electrode of the another VDMOS transistor, metal region on the front face including the source electrode of the another VDMOS transistor, and means for biasing the gate electrode of the another VDMOS transistor to cause a low impedance to subsist between the source and drain electrodes of the another VDMOS transistor to couple the bias voltage from the metallization layer on the back face to the metal region on the front face.

12. The combination of claim 11 wherein the substrate includes first and second layers having like conductivity types and surfaces respectively forming the front and back faces, the second layer having a greater doping concentration than that of the first layer, the means for biasing including a Zener diode having first and second opposite conductivity regions on the front face in the first layer connected respectively to the gate and source electrodes.

13. The combination of claim 12 wherein the substrate layers are N doped;
   first P regions forming first, second and third wells on the first layer respectively for the lateral logic transistors, parts of the power transistor and parts of the another transistor, respectively; second P regions having a doping level greater than that of the first P regions forming the first conductivity type region of the Zener diode regions in the first, second and third wells; first N regions on the front face forming channels for said power and another transistors; third P regions on the front face forming the first region of the Zener diode and a channel of the power transistor; and second N regions on the front face having a doping level greater than the doping level of the first N regions, forming the second region of the zener diode and source regions for said transistors.

14. The combination of claim 13 wherein the first P regions, second P regions, first N regions, third P regions and second N regions are respectively formed during first, second, third, fourth and fifth diffusion steps on the front face, the first through fifth diffusions step being performed in the named order.

15. The combination of claim 11 wherein the substrate includes first and second N doped layers having surfaces respectively forming the front and back faces, the second layer having a doping level greater than that of the first layer;
   first P regions forming first, second and third wells on the first layer for the lateral logic transistors, parts of the power transistor and parts of the another transistor, respectively; second P regions having a doping level greater than that of the first P region forming regions in the first, second and third wells; first N regions on the front face forming channels for said power and another transistors; third P regions on the front face forming a channel of the power transistor; and second N regions on the front face having a doping level greater than the doping level of the first N regions, forming source regions for said transistors.

16. The combination of claim 15 wherein the first P regions, second P regions, first N regions, third P regions and second N regions are respectively formed during first, second, third, fourth and fifth diffusion steps on the front face, the first through fifth diffusions step being performed in the named order.

17. In combination, a semiconductor substrate having front and back faces,
   a metallization layer on the back face connected to a bias voltage.
   lateral logic transistors having all electrodes thereof on the front face,
   a VDMOS power transistor having source and gate electrodes on the front face and a drain electrode formed by the metallization layer on the back face,
   and means for coupling the bias voltage from the metallization layer on the back face through the substrate to a metal region on the front face independently of the operation of the VDMOS power transistor without affecting the operation of the lateral logic transistors and the VDMOS power transistor and for deriving a bias voltage for the gate of the power transistor.

18. The combination of claim 17 wherein the means for coupling includes another VDMOS transistor having source and gate electrodes on the front face, the metallization on the back face forming a drain electrode of the another VDMOS transistor, the metal region including the source electrode of the another VDMOS transistor, and means for biasing the gate electrode of the another VDMOS transistor to cause a low impedance to subsist between the source and drain electrodes of the another VDMOS transistor.

19. The combination of claim 18 wherein the substrate includes first and second layers having like conductivity types and surfaces respectively forming the front and back faces, the second layer having a greater doping concentration than that of the first layer, the means for biasing including a Zener diode having first and second opposite conductivity regions on the front face in the first layer connected respectively to the gate and source electrodes of the another VDMOS transistor, the bias voltage for the gate electrode of the power transistor being derived at the source of the another transistor and being determined by the voltage across the regions of the Zener diode.

20. An integrated circuit comprising a semiconductor substrate including an enhanced VDMOS transistor having source, drain and gate electrodes, depleted and enhanced lateral MOS logic transistors, a depleted VDMOS transistor having source, drain and gate electrodes, and a Zener diode having first and second opposite conductivity regions, the drains of said VDMOS transistors having a common connection, the Zener diode opposite conductivity regions being connected to the gate and source electrodes of the depleted VDMOS transistor to establish a reference potential for the gate of the enhanced VDMOS transistor at the source electrode of the depleted VDMOS transistor.

21. The circuit of claim 20 wherein the substrate includes front and back faces, the back face being metallized to form the drain electrodes of the VDMOS transistors, the front face including diffused regions to form: (a) channel and source regions for the logic and VDMOS transistors, (b) drain regions for the logic transistors and (c) the opposite conductivity regions of the Zener diode.

22. The circuit of claim 21 wherein one of the logic transistors comprises a switch for selectively connecting the reference voltage to the gate electrode of the enhanced VDMOS transistor.

23. The circuit of claim 20 wherein one of the logic transistors comprises a switch for selectively connecting the reference voltage to the gate electrode of the enhanced VDMOS transistor.

24. A method of forming an integrated circuit on a semiconductor substrate including an enhanced VDMOS transistor having source, drain and gate electrodes, depleted and enhanced lateral MOS logic transistors, a depleted VDMOS transistor having source, drain and gate electrodes, the drains of said VDMOS transistors having a common connection, the substrate including N and P layers having surfaces of like first conductivity and type respectively forming the front and back faces, the P layer having a doping level greater than that of the N layer;

first regions of a second conductivity type forming first, second and third wells on the N layer respectively for the lateral logic transistors, parts of the power transistor and parts of the another transistor; second regions of the second conductivity type having a doping level greater than that of the first regions of the second conductivity type and forming regions in the first, second and third wells; first regions of the first conductivity type on the front face forming channels for said power and another transistors; third regions of the second conductivity type on the front face forming a channel of the power transistor; and second regions of the first conductivity type on the front face having a doping level greater than the doping level of the first regions of the first conductivity type, forming source regions for said transistors, the method comprising forming the first P regions, second P regions, first N regions, third P regions and second N regions during first, second, third, fourth and fifth diffusion steps on the front face, the first through fifth diffusion steps being performed in the named order.

25. The method of claim 24 wherein the substrate includes a Zener diode having N and P regions in the first layer on the upper face respectively connected to the source and gate electrodes of the depleted VDMOS, the N and P conductivity regions of the Zener diode being respectively formed during the fourth and fifth steps.

* * * * *